(12) United States Patent
Su et al.

(10) Patent No.: US 8,624,404 B1
(45) Date of Patent: Jan. 7, 2014

(54) INTEGRATED CIRCUIT PACKAGE HAVING OFFSET VIAS

(75) Inventors: Michael Z. Su, Round Rock, TX (US); Lei Fu, Austin, TX (US); Frank Kuechenmeister, Dresden (DE)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 13/532,126

(22) Filed: Jun. 25, 2012

(51) Int. Cl.
*H01L 23/52* (2006.01)
*H01L 23/48* (2006.01)
*H01L 29/40* (2006.01)

(52) U.S. Cl.
USPC ............ 257/781; 257/E23.021; 257/738; 257/778; 438/612; 438/614

(58) Field of Classification Search
USPC ............ 257/E23.02, E23.021, E23.04, 723, 257/737, 738, 774, 778, 780, 781; 438/108, 438/612, 614; 174/250, 260, 261; 427/123
See application file for complete search history.

(56) References Cited

U.S. PATENT DOCUMENTS

| | | | | |
|---|---|---|---|---|
| 5,478,973 A * | 12/1995 | Yoon et al. | ............. | 174/260 |
| 5,773,888 A * | 6/1998 | Hosomi et al. | ............. | 257/737 |
| 6,075,290 A * | 6/2000 | Schaefer et al. | ............. | 257/737 |
| 6,107,109 A * | 8/2000 | Akram et al. | ............. | 438/15 |
| 6,703,069 B1 * | 3/2004 | Moon et al. | ............. | 427/123 |
| 7,034,402 B1 * | 4/2006 | Seshan | ............. | 257/781 |
| 7,095,116 B1 * | 8/2006 | Kelkar et al. | ............. | 257/737 |
| 7,197,727 B1 | 3/2007 | Su | | |
| 7,206,703 B1 | 4/2007 | Papageorgiou et al. | | |
| 7,420,131 B2 * | 9/2008 | Saiki et al. | ............. | 174/266 |
| 7,529,449 B2 * | 5/2009 | Ormond et al. | ............. | 385/52 |
| 7,812,438 B2 * | 10/2010 | Jadhav et al. | ............. | 257/698 |
| 7,834,449 B2 * | 11/2010 | Kaufmann et al. | ............. | 257/723 |
| 8,198,133 B2 * | 6/2012 | Daubenspeck et al. | ............. | 438/108 |
| 8,212,357 B2 * | 7/2012 | Daubenspeck et al. | ............. | 257/738 |
| 8,269,348 B2 * | 9/2012 | Fazelpour | ............. | 257/738 |
| 2002/0016523 A1 | 2/2002 | Slaugh et al. | | |
| 2005/0029677 A1 * | 2/2005 | Huang | ............. | 257/780 |
| 2006/0227237 A1 | 10/2006 | Kienzle et al. | | |
| 2007/0228561 A1 * | 10/2007 | Matsuki et al. | ............. | 257/737 |
| 2008/0174329 A1 | 7/2008 | Papageorgiou et al. | | |
| 2008/0191318 A1 | 8/2008 | Su et al. | | |
| 2009/0057887 A1 | 3/2009 | Mclellan et al. | | |
| 2009/0065952 A1 | 3/2009 | Su et al. | | |
| 2009/0302427 A1 | 12/2009 | Su et al. | | |
| 2010/0207250 A1 | 8/2010 | Su et al. | | |
| 2011/0031603 A1 | 2/2011 | Su et al. | | |

FOREIGN PATENT DOCUMENTS

| | | |
|---|---|---|
| WO | 2006022911 A1 | 3/2006 |
| WO | 2008016513 A1 | 2/2008 |
| WO | 2010096473 A2 | 8/2010 |

OTHER PUBLICATIONS

Xuefeng Zhang, Chip package interaction (CPI) and its impact on the reliabilty of flip-chip packages, (Doctoral dissertation), 2009, The University of Texas at Austin.

* cited by examiner

*Primary Examiner* — Chris Chu
(74) *Attorney, Agent, or Firm* — Faegre Baker Daniels LLP

(57) ABSTRACT

Integrated circuit packages comprise vias, each of which extends from a pad in communication with an integrated circuit on a semiconductor chip through insulating material overlying the semiconductor chip to an attachment surface facing a substrate. The portion of each via proximate the attachment surface is laterally offset from the portion proximate the pad from which it extends in a direction away from the center of the semiconductor chip. Metallic material received in the vias mechanically and electrically interconnects the semiconductor chip to the substrate.

25 Claims, 10 Drawing Sheets

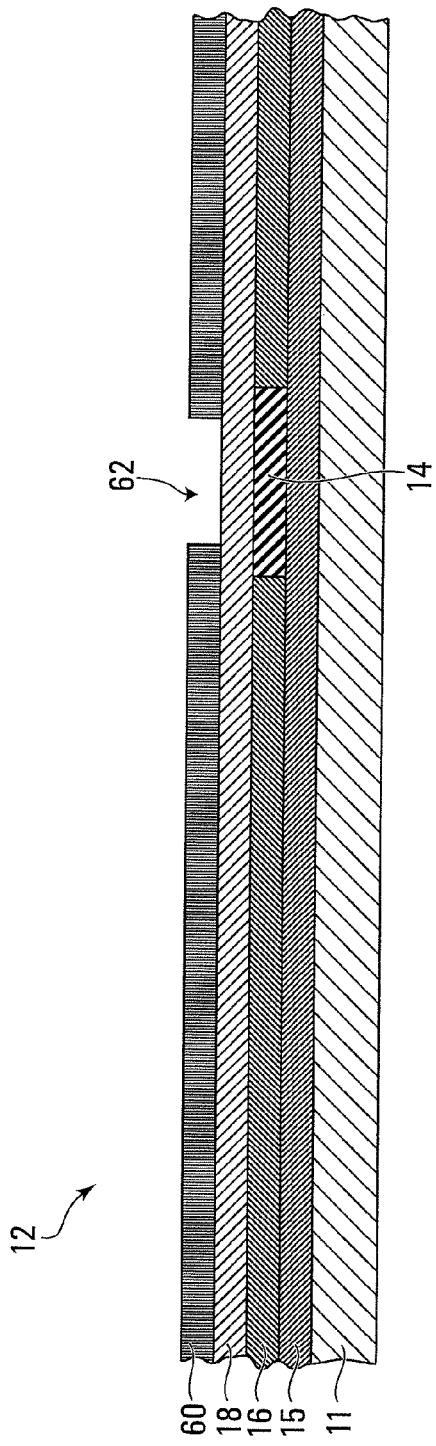
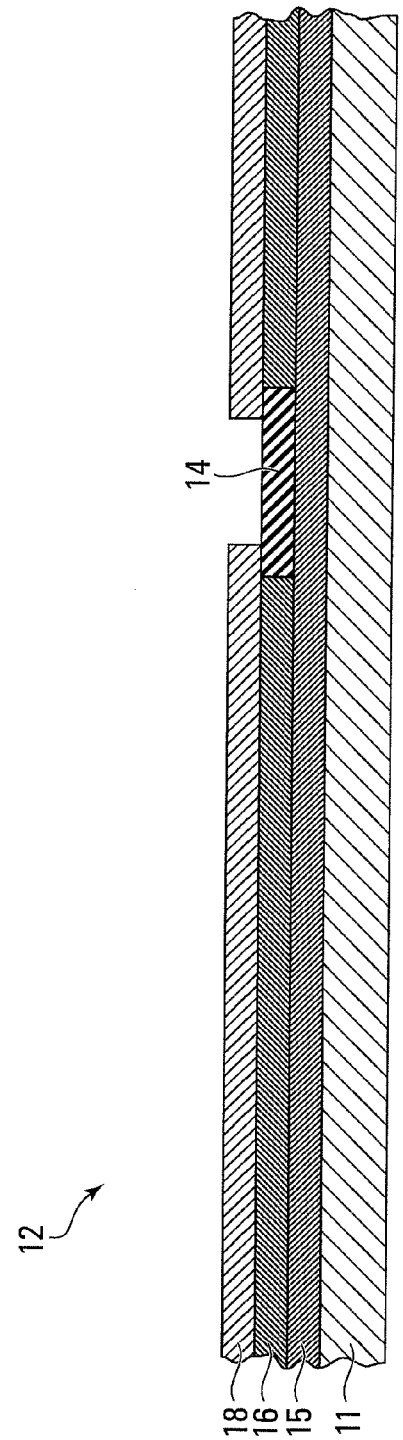
FIG. 5A
FIG. 5B

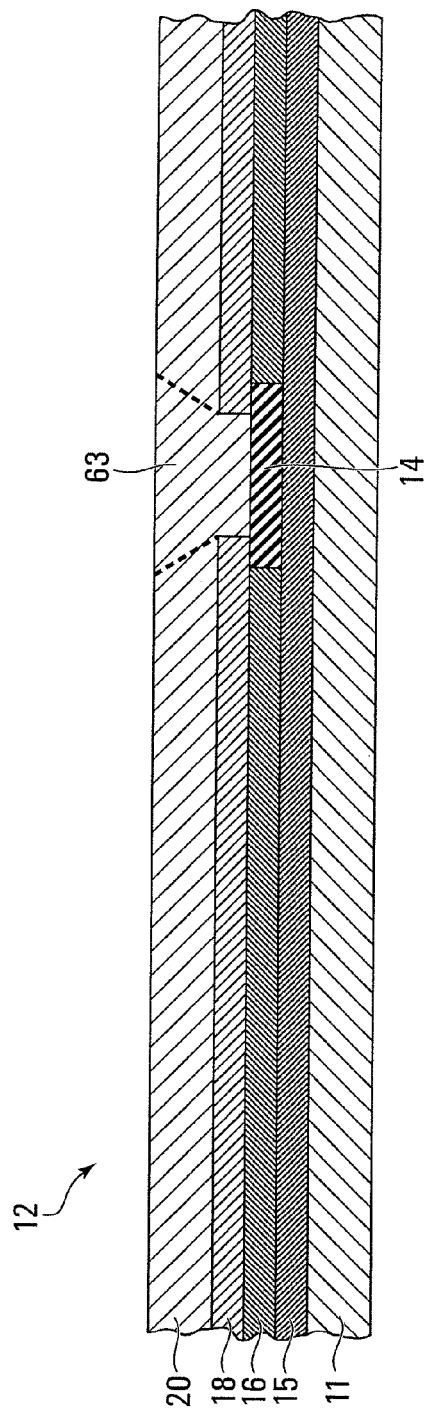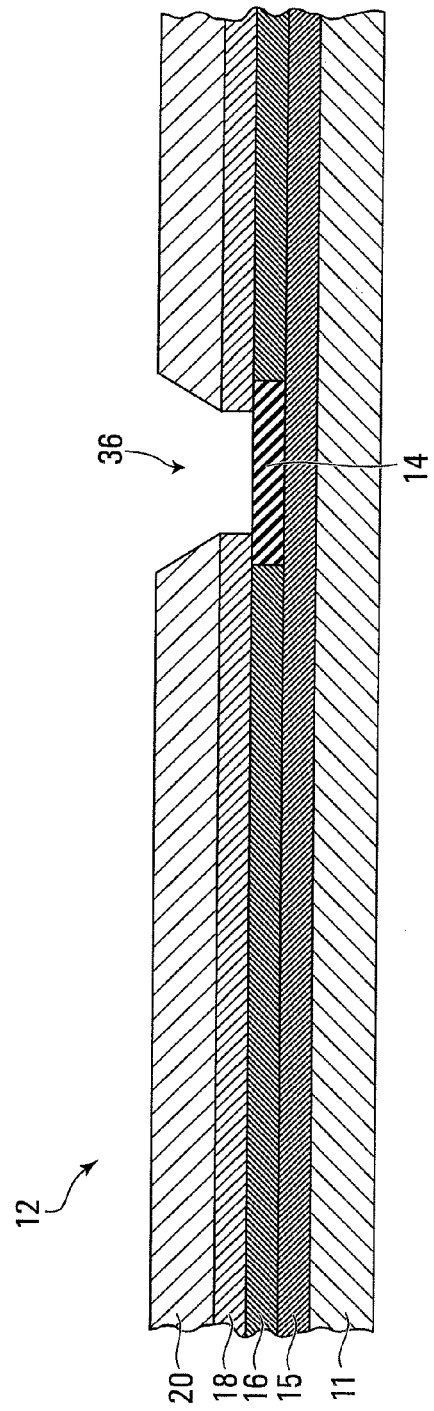

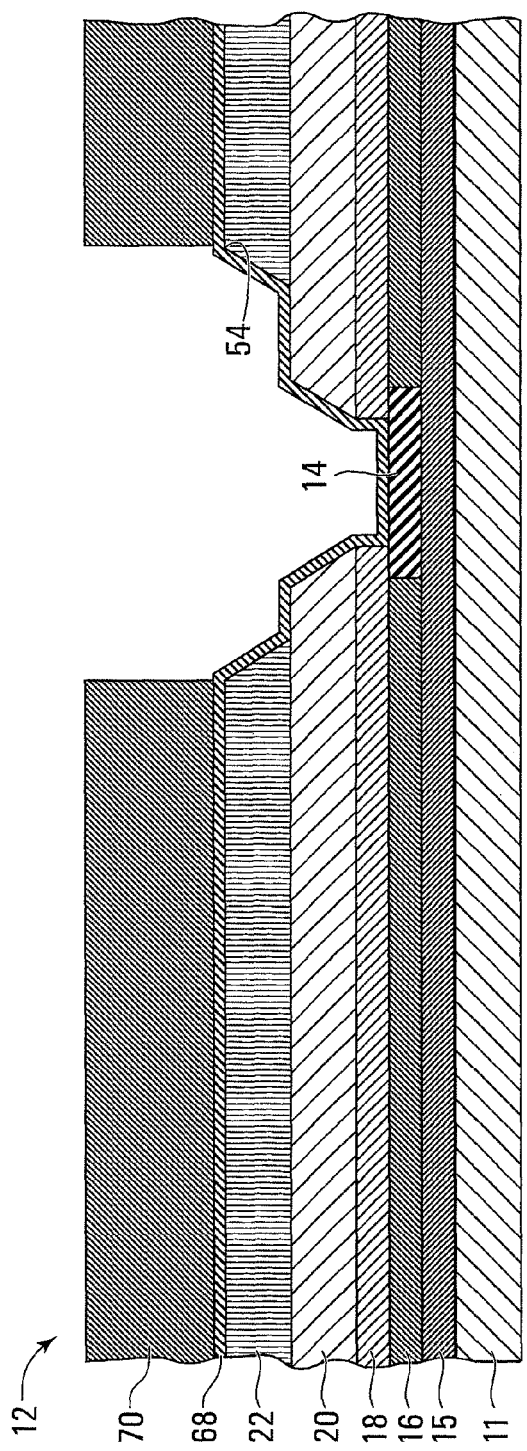
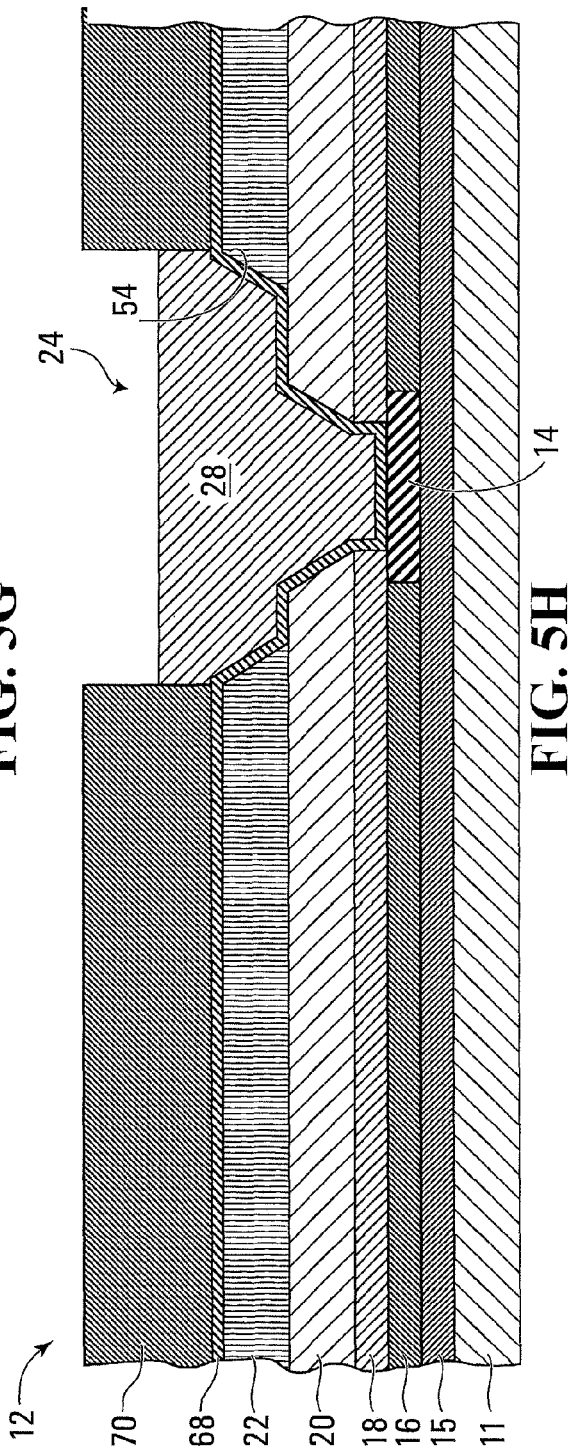
FIG. 5G
FIG. 5H

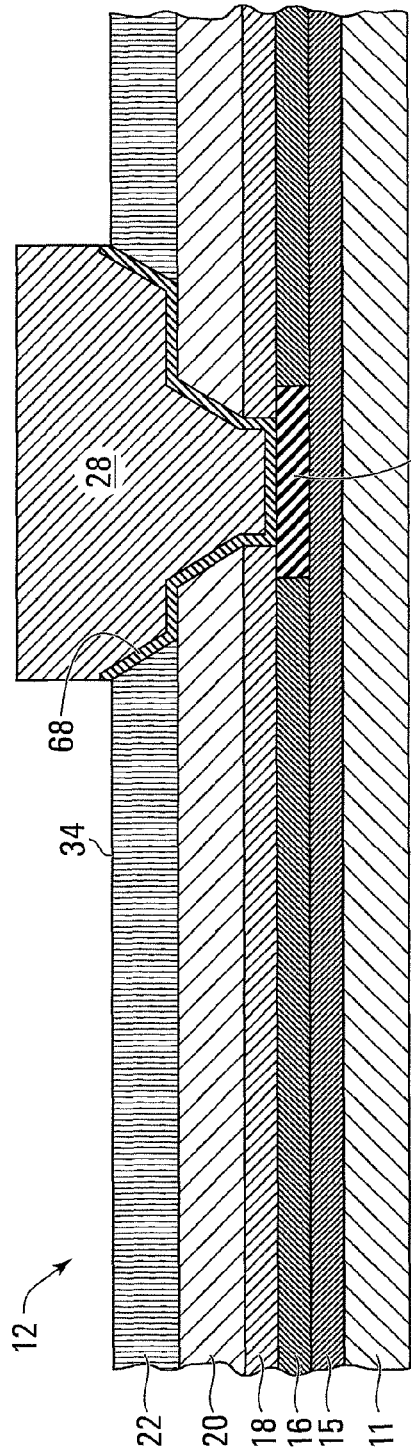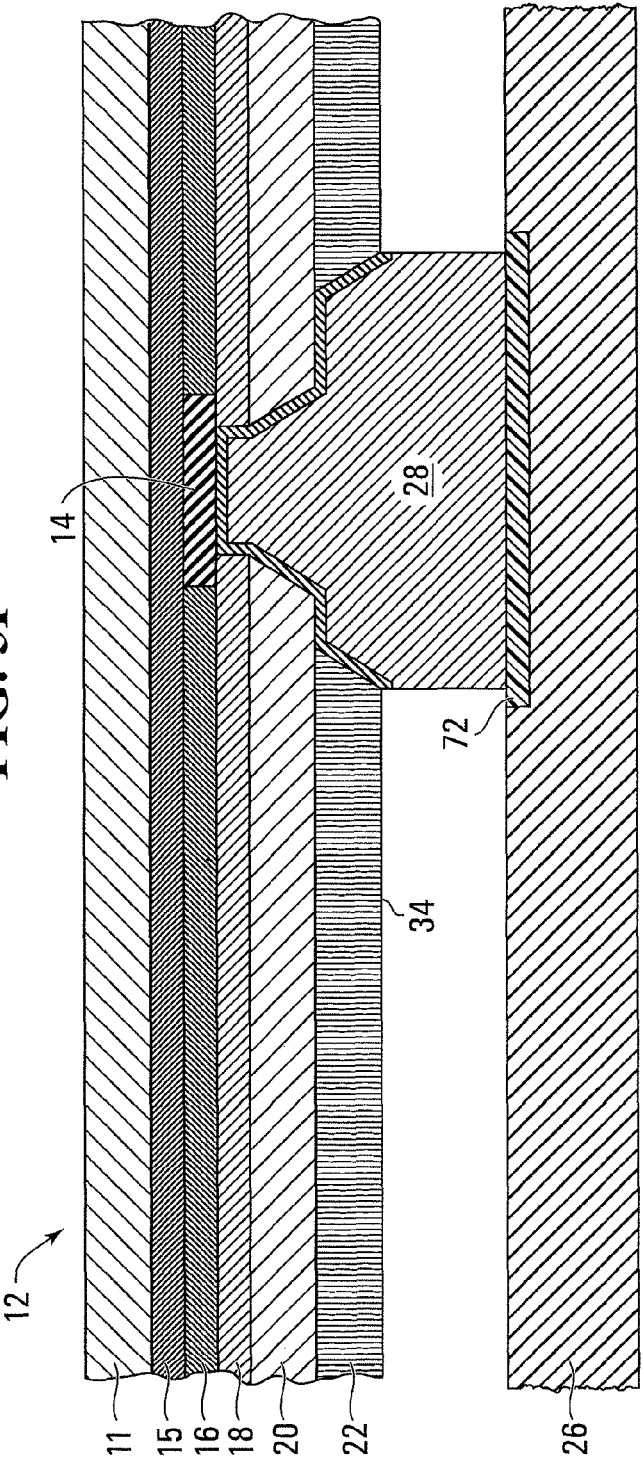

INTEGRATED CIRCUIT PACKAGE HAVING OFFSET VIAS

FIELD OF THE INVENTION

The present invention relates generally to integrated circuit packaging, and more particularly to integrated circuit packages having vias for receiving solder bumps to interconnect a die to a substrate.

BACKGROUND OF THE INVENTION

A die may be formed of a semiconductor chip overlaid with a number of alternating layers of metallic materials and interlayer dielectric (ILD) materials. The die may further include passivation materials overlaying the metallic and ILD layers, and one or more layers of insulating material, such as polyimides overlaying the passivation materials.

Typically, solder bumps or other interconnecting structures extending through the layers of insulating material interconnect the die to a substrate, typically formed of an organic material. Collectively, the die and interconnected substrate are typically referred to as an integrated circuit package.

Each of the different materials making up the package has a different coefficient of thermal expansion (CTE). For example, a silicon semiconductor chip may have a CTE of approximately $2.6 \times 10^{-6}/°$ C.; polyimide may have a CTE of approximately $35 \times 10^{-6}/°$ C.; lead-free solder material may have a CTE in the range of approximately $20$-$30 \times 10^{-6}/°$ C. and an organic substrate may have a CTE of approximately $17 \times 10^{-6}/°$ C. During manufacture and use, the temperature of the package changes, causing the different materials to expand or contract according to their respective CTE.

CTE mismatches in turn result in thermo-mechanical stress on package components due to differential expansion. Components also tend to warp when subjected to heat, based on CTE differences between the components. This causes peeling stress as components warp away from one another. These stresses are typically referred to as chip package interaction (CPI) stress.

Historically, CPI stress was mitigated, at least in part, by solder bumps interconnecting the die to the substrate. The solder bumps were typically formed from relatively ductile leaded alloys which were capable of deforming in response to differential expansion and warping, thus absorbing stress, and tending to isolate the die and substrate from one another.

Recently, however, leaded solder materials have been replaced with lead-free materials. These lead-free materials tend be stiffer, that is, have lower ductility than leaded materials. As a result, the lead-free solder bumps tend to absorb less stress. In some cases, this can cause cracking or de-lamination of the die from the rest of the package.

This problem is exacerbated by other material choices made necessary by performance requirements. In particular, as semiconductor chip feature sizes decrease, it becomes necessary for performance reasons to select ILD materials having dielectric constant (K) of less than 3 (low-K materials) or less than 2.7 (ultra-low K (ULK) materials). Such materials often have lower shear strength and cohesive strength and poorer adhesion to adjacent die layers than dielectric materials with K>3. Accordingly, low-K and ULK ILD materials are particularly prone to mechanical failure such as cracking or de-lamination.

Accordingly, there is a need for semiconductor package designs which provide improved protection against thermo-mechanical stresses.

SUMMARY OF EMBODIMENTS OF THE INVENTION

Exemplary of the present invention, an integrated circuit package is formed with offset vias. Each via of the integrated circuit pacakage extends from a pad in communication with an integrated circuit on a semiconductor chip through insulating material overlying the semiconductor chip to an attachment surface facing a substrate. Metallic material received in the vias mechanically and electrically interconnects the semiconductor chip to the substrate. The portion of each via proximate the attachment surface is laterally offset from the portion proximate the pad from which it extends in a direction away from the centre of the semiconductor chip.

According to one aspect of the invention, an integrated circuit package is disclosed, comprising: a semiconductor chip having an integrated circuit formed thereon; at least one pad in electrical communication with the integrated circuit; an insulating layer overlaying the semiconductor chip, the insulating layer having an attachment surface for attaching the semiconductor chip to a substrate; at least one via extending through the insulating layer from the attachment surface to the pad, the via comprising a first via opening proximate the pad and a second via opening proximate the attachment surface, wherein the centre of the second opening is laterally offset from the centre of the first opening in a direction away from a centre of the semiconductor chip; a substrate; a metallic material received in the via mechanically and electrically interconnecting the pad to the substrate, and attaching the semiconductor chip to the substrate.

According to another aspect of the invention, a method of manufacturing an integrated circuit die comprising a semiconductor chip having an integrated circuit formed thereon and at least one pad in electrical communication with the integrated circuit is disclosed. The method comprises: forming a first insulating layer overlaying the semiconductor chip; forming a first via extending from the pad through the first insulating layer along a first longitudinal axis; forming a second insulating layer overlaying the first insulating layer; and forming a second via in communication with the first via, the second via extending through the second insulating layer along a second longitudinal axis, the second longitudinal axis offset away from the first longitudinal axis in a direction away from a centre of the die.

According to another aspect of the invention, an integrated circuit die is disclosed, comprising: a semiconductor chip with an integrated circuit thereon; a plurality of pads in electrical communication with the integrated circuit; an insulating layer overlying the integrated circuit die, the insulating layer having an attachment surface for attaching the semiconductor chip to a substrate; a plurality of vias, each one of the vias extending through the insulating layer to a corresponding one of the pads for receiving a metallic structure to interconnect the integrated circuit die with a substrate; wherein each one of the vias has a first opening proximate the semiconductor chip and a second opening proximate the attachment surface and a centre of the second opening is located farther from a centre of the integrated circuit die than the centre of the first opening.

According to another aspect of the invention, an integrated circuit package is disclosed, comprising: a substrate and a die. The die comprises a semiconductor chip, an insulating layer overlying the semiconductor chip and a plurality of vias through the insulating layer. The integrated circuit further comprises a plurality of metallic interconnecting structures, each one of the interconnecting structures received in a corresponding one of the vias and each one of the metallic interconnecting structures bonded to the die at a first end and to the substrate at a second end, wherein the second end is located farther from the geometric centre of the die than the first end.

According to yet another aspect of the present invention, there is provided an integrated circuit die, comprising: semiconductor chip with an integrated circuit thereon; a plurality of pads in electrical communication with the integrated circuit; an insulating layer overlying the integrated circuit die, the insulating layer having an attachment surface for attaching the semiconductor chip to a substrate; a first plurality of vias, arranged in a pattern, each one of the first plurality of vias extending through the insulating layer to a corresponding one of the pads for receiving a metallic structure to interconnect the integrated circuit die with a substrate; wherein each one of the first plurality of vias has a first opening proximate the semiconductor chip and a second opening proximate the attachment surface and a centre of the first opening is laterally offset relative to a centre of the second opening by a first distance in a direction towards the centre of the integrated circuit die; a second plurality of vias, arranged in a pattern concentric with the pattern of the first plurality of vias, each one of the second plurality of vias extending through the insulating layer to a corresponding one of the pads for receiving a metallic structure to interconnect the integrated circuit die with a substrate; wherein each one of the second plurality of vias has a first opening proximate the semiconductor chip and a second opening proximate the attachment surface and a centre of the first opening is laterally offset relative to a centre of the second opening by a second distance different from the first distance in a direction towards the centre of the integrated circuit die.

According to yet another aspect of the present invention, there is provided integrated circuit die, comprising: a semiconductor chip with an integrated circuit thereon; a plurality of pads in electrical communication with the integrated circuit; an insulating layer overlying the integrated circuit die, the insulating layer having an attachment surface for attaching the semiconductor chip to a substrate; a plurality of vias, each one of the vias extending through the insulating layer to a corresponding one of the pads for receiving a metallic structure to interconnect the integrated circuit die with a substrate; wherein the plurality of vias are arranged in at least a first pattern centred at a centre of the integrated circuit die and a second pattern concentric with the first pattern, and each one of the vias has a first opening proximate the semiconductor chip and a second opening proximate the attachment surface, wherein a centre of the first opening is laterally offset from the centre of the second opening in a direction towards the centre of the integrated circuit die and wherein the offset is by a first distance in the vias arranged in the first pattern and by a second distance different from the first distance in the vias arranged in the second pattern.

BRIEF DESCRIPTION OF THE DRAWINGS

In the figures, which illustrate by way of example only, embodiments of this invention:

FIGS. 5A-5K are partial cross-sectional views of a subassembly of the semiconductor package of FIG. 1 at different stages of manufacturing.

DETAILED DESCRIPTION

Figure 1:
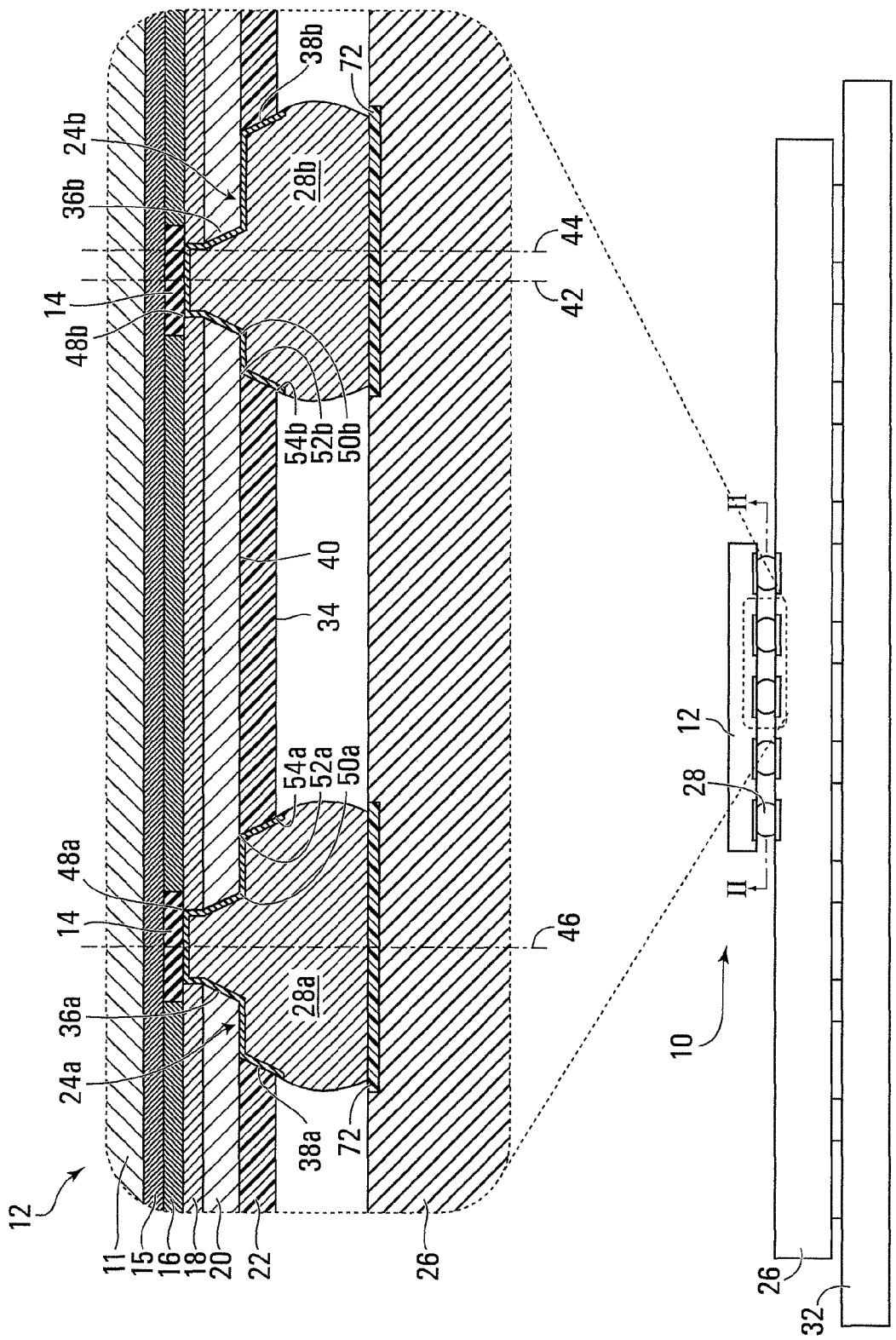
FIG. 1 is a cross-sectional view of a semiconductor package exemplary of an embodiment of the invention.

FIG. 1 depicts a semiconductor package 10, exemplary of an embodiment of the present invention. Semiconductor package 10 generally includes a die 12 interconnected to a substrate 26 by a series of solder bumps 28. Die 12 includes a semiconductor chip 11 with an integrated circuit thereon (not shown).

Die 12 is attached to substrate 26 in flip-chip. Solder bumps 28 extend from an attachment surface 34 of die 12. Die 12 is attached to the substrate by way of these bumps, which are re-flowed for mechanical and electrical interconnection to substrate 26. Optionally, an underfill (not shown) may further mechanically attach die 12 to substrate 26.

The integrated circuit is interconnected by way of a back end of line (BEOL) stack including BEOL pads 14. In addition, the BEOL stack includes inter-layer dielectric (ILD) material 15, 16 which electrically separates conductive elements of the BEOL stack. ILD material 15, 16 may be formed of a low-K dielectric material such as HSSQ, diamond-like carbon, carbon doped $SiO_2$ or SiCOH or an ULK dielectric material such as porous SiCOH. For simplicity, only part of the BEOL stack is depicted, including BEOL pads 14 and ILD material 15, 16. BEOL pads 14 are connected to other elements of BEOL stack (not shown) by conductive traces (not shown) passing through ILD layer 15. The BEOL stack may include additional layers of metallic traces and ILD material between semiconductor chip 11 and BEOL pads 14 and ILD material 15, 16.

Die 12 may also include a layer of passivation material 18 overlying BEOL pads 14 and ILD material 16 to protect elements of die 12 from corrosion. Atop passivation material 18, die 12 may include layers of insulating material. Package 10 is illustrated with two layers 20, 22 of insulating material, but may have more or fewer layers. Layers 20, 22 may be formed of polyimide, polybenzoxadiazole, benzocyclobuten or similar material.

Vias 24 are formed through layers 20, 22 to receive solder bumps 28 for electrically and mechanically interconnecting die 12 to a substrate 26 by way of BEOL pads 14. Solder bumps 28 are formed of an electrically conductive material, and extend from attachment surface 34 of die 12. Solder bumps 28 may be formed of a lead-free material, such as SnAg, SnCu, SnAgCu or other lead-free alloys. In fine-pitch applications, solder bumps 28 may be Cu pillars. One or more conductive metallic layers (not shown) may also be formed between solder bumps 24 and BEOL pad 14. Optionally, the region between attachment surface 34 and substrate 26 proximate solder bumps 28 may be filled with an epoxy underfill (not shown) to protect and/or mechanically reinforce the interconnection.

Substrate 26 may be mounted on a circuit board 32 for interconnecting semiconductor package 10 to other devices interconnected to the circuit board. Typically, substrate 26 is formed of an organic material, but as will be appreciated, may instead be formed of any suitable material known to skilled persons.

Figure 2:
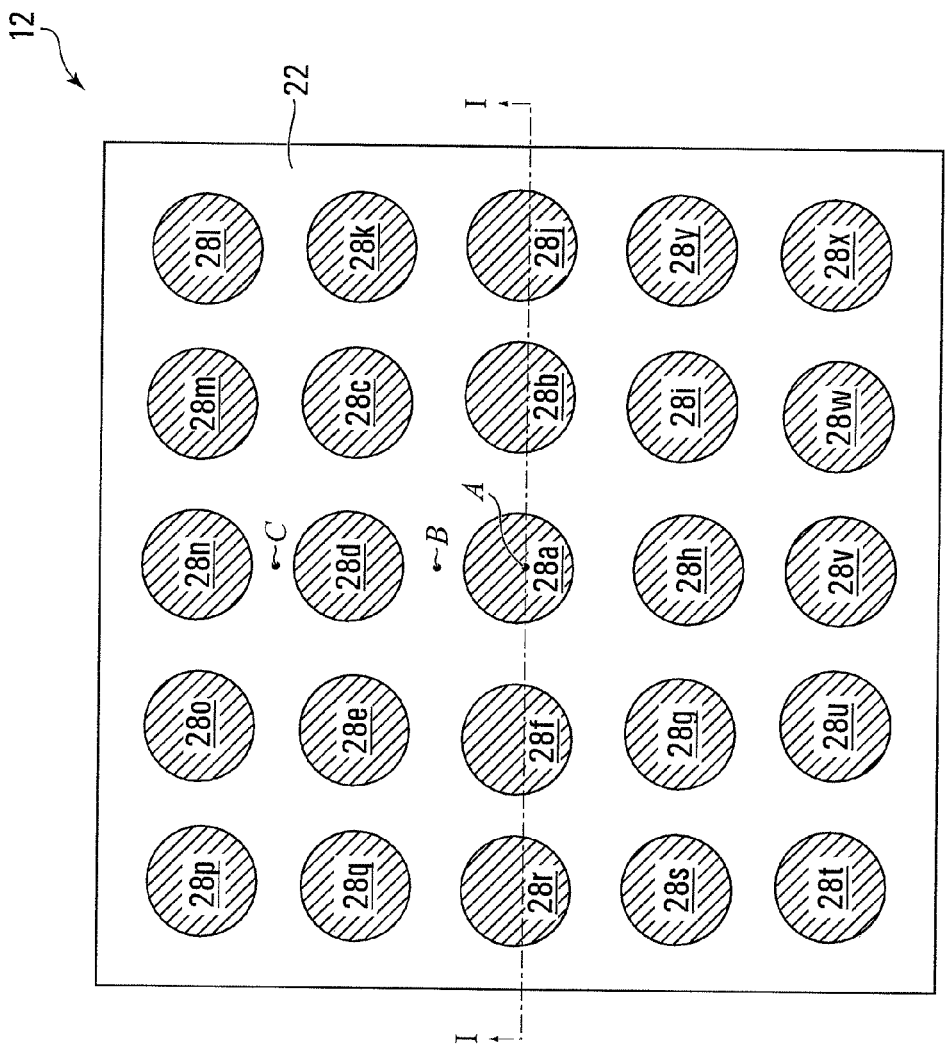
FIG. 2 is a cross-sectional view of the semiconductor package of FIG. 1 taken along line II-II.

FIG. 2 depicts a portion of the underside of layer 22 of insulating material, showing the array of solder bumps (collectively, solder bumps 28; individually, solder bumps 28a through 28y) for interconnecting semiconductor package 10 to substrate 26. Solder bumps are arranged generally in a 5×5 grid pattern. However, solder bumps 28 may instead be arranged in alternate patterns with more or fewer bumps according to functional requirements of semiconductor package 10.

As shown, solder bump 28a is located at the centre of die 12, marked point A, which lies over the centre of semiconductor chip 11. Solder bumps 28b through 28y are located away from the centre of die 12. However, solder bumps 28 need not include a bump at the centre of die 12.

During manufacture and in operation, semiconductor package 10 may be subjected to heat. Unfortunately, this causes the components of semiconductor package 10 to expand and/or warp at rates corresponding to their respective coefficients of thermal expansion, which, as previously noted, can vary widely.

As solder bumps 28 mechanically interconnect die 12 with substrate 26, differential expansion and warping of die 12 and substrate 26 causes thermo-mechanical shear and peeling stress on solder bumps 28, BEOL pad 14, the joints between solder bumps 28 and BEOL pad 14 and/or the joints between solder bumps 28 and substrate 26. Further, stress on BEOL pads 14 may impose stress on the adjacent ILD material 15, 16. Shear stress due to differential expansion and warping may also be present, depending on conditions and package characteristics.

Each of die 12 and substrate 26 will tend to thermally expand away from its respective centre in all directions. Thus, the cumulative effect of expansion increases with increasing distance from the respective geometric centres of die 12 and substrate 26. The cumulative effects of warping will likewise increase with increasing distance from the centres of die 12 and substrate 26. Accordingly, the magnitude of thermo-mechanical stress increases with increasing distance from the centres of die 12 and substrate 26.

Thus, as illustrated in FIG. 2, thermo-mechanical stress will be close to zero at the centre (location A in FIG. 2). Thermo-mechanical stress will be higher at location B relative to location A, and higher still at location C. For the same reason, peak thermo-mechanical stress increases with increasing size of die 12.

The thermo-mechanical stress, particularly peeling stress, can cause cracks to form and propagate in ILD material 15, 16. Partial or even full de-lamination of layers of ILD material 15, 16 may also occur. ILD material 15, 16 and the interfaces between ILD material 15, 16 and adjacent components of semiconductor package 10 are particularly vulnerable to both cracking and de-lamination: while low-K and ULK ILD materials are often desirable or necessary for performance reasons, such materials generally have poor mechanical properties such as low strength.

Each of solder bumps 28a through 28y is received in a corresponding via 24a through 24y (collectively, vias 24). Vias 24a and 24b are depicted in cross-section in the enlarged portion of FIG. 1. Via 24a is located at the centre of die 12 and over the centre of semiconductor chip 11. Via 24b is laterally offset away from the centre of die 12. The geometric arrangement of via 24b is representative of the arrangement of vias 24c through 24y, which are likewise laterally offset away from the centre of die 12. Vias 24 have first via portions 36 and second via portions 38 (individually, via portions 36a to 36y and 38a to 38y, respectively). First via portions 36 extend from BEOL pads 14 through layer 20. Second via portions 38 extend from attachment surface 34 through layer 22 and are in communication with first via portions 36. Thus, vias 24 extend away from BEOL pads 14 through both layers 20 and 22 of insulating material.

Each one of first via portions 36 and second via portions 38 extends along a longitudinal axis which passes through the centre of each respective via portion. The longitudinal axis of first via portion 36b of via 24b is axis 42, while the longitudinal axis of second via portion 38b of via 24b is axis 44. First and second via portions 36a and 38a of via 24a are coaxial and extend along longitudinal axis 46.

First via portions 36 have openings 48 proximate BEOL pads 14 (shown in FIG. 1 as openings 48a,48b of first via portions 36a, 36b, respectively) and openings 50 where first via portions 36 intersect with second via portions 38 (likewise shown as 50a, 50b). Similarly, second via portions have openings 52 at the intersection of the first and second via portions and openings 54 at attachment surface 34 (shown as 52a, 52b and 54a, 54b, respectively). Via portions 36 and 38 are frustoconical in shape, increasing in diameter from a minimum at openings 48, 52, respectively, to a maximum at openings 50, 54, respectively. The minimum diameter of second via portions 38 is greater than the maximum diameter of first via portions 36. As a result of vias 24 having this geometry, the sidewalls of vias 24 have flat steps atop the surface of layer 20 where the first and second portions intersect. As will be appreciated, the shape of vias 24 determines the shape of solder bumps 28. Therefore, because of the geometry of vias 24, solder bumps 28 sit on the flat steps in the walls of vias 24. Also as a result of the shape of vias 24, solder bumps 28 are larger in diameter where they bond to substrate 26 than where they bond to BEOL pads 14.

In alternate embodiments, vias 24 may have different shapes. For example, first and second portions may be cylindrical in shape, with vertical sidewalls and a step in the sidewalls where the first and second portions intersect.

Figure 3:
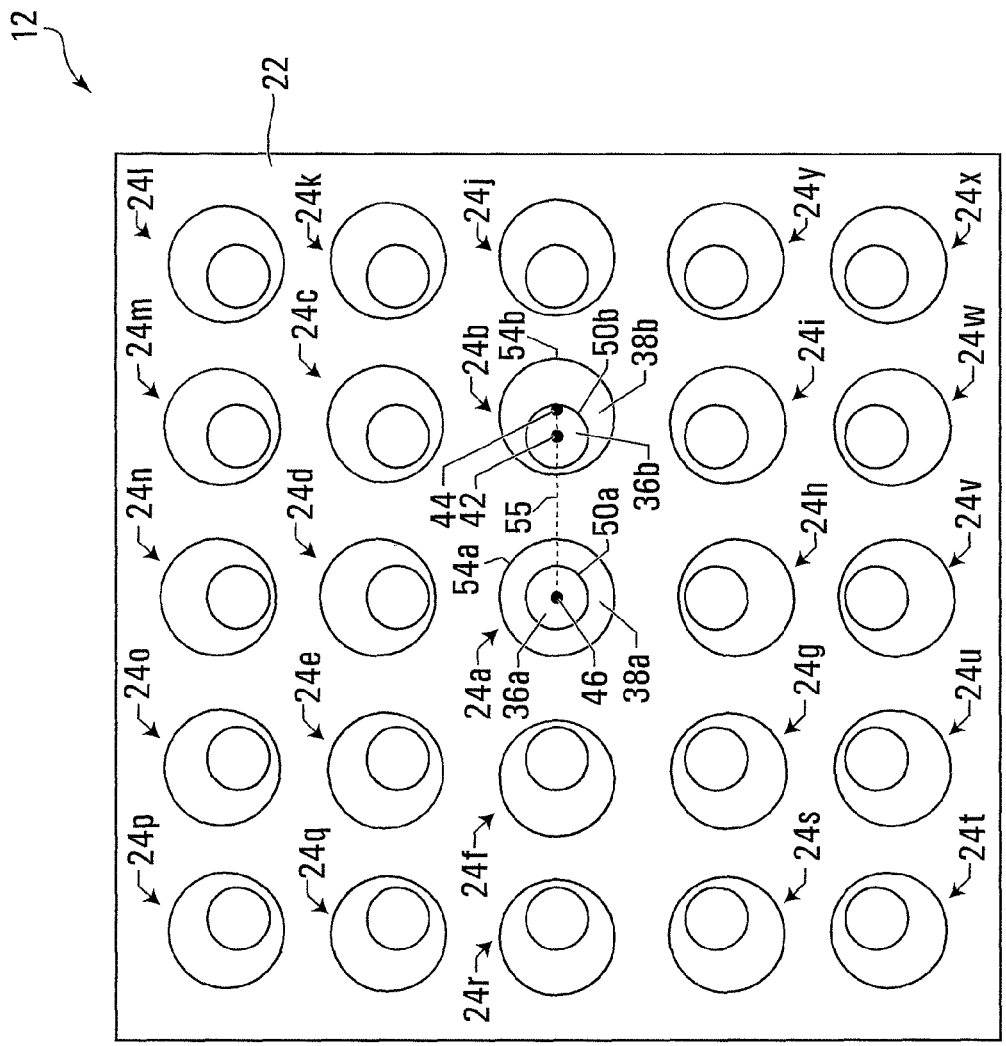
FIG. 3 is a simplified schematic view of the cross-section depicted in FIG. 2.

Turning to FIG. 3, the underside of layer 22 of insulating material is shown in simplified schematic view. For the purpose of illustrating the configuration of vias 24, solder bumps 28 are omitted from FIG. 3. In addition, only openings 50 of first via portions 36 and openings 54 of second via portions 38 are shown. As previously noted, via 24a is located at the centre of die 12. First and second portions 36a and 38a of via 24a are co-axial, and extend along longitudinal axis 46, which passes through the centre of die 12 and the centre of semiconductor chip 11. Conversely, via 24b is located away from the centre of die 12. Second via portion 38b of via 24b is laterally offset from first via portion 36b in a direction away from the geometric centres of die 12 and semiconductor chip 11. In particular, longitudinal axis 44 of second via portion 38b is laterally offset from longitudinal axis 42 in a direction away from the centres of die 12 and semiconductor chip 11. Vias 24c through 24y are likewise offset away from the centre of die 12, and their respective second via portions are offset away from their respective first via portions in a direction away from the centre of die 12 and the centre of semiconductor chip 11.

As vias 24 define the shape of solder bumps 28, the portions of solder bumps 28 proximate substrate 26 are likewise offset from the portions proximate BEOL pads 14 in a direction away from the geometric centres of die 12 and semiconductor chip 11. Thus, offsetting second via portions 38 away first via portions 36 in this way locates bonds between solder bumps 28 and substrate 26 where thermo mechanical stress is highest. By contrast, if second via portions 38 were not offset from first via portions 36, the bonds between solder bumps 28 and substrate 26 would be located in lower-stress regions closer to the centres of die 12 and semiconductor chip 11. As will be appreciated, since via 24a is located at the centre of die 12, an offset in any given direction would result in part of second via portion 38a being located farther from the centre of die 12, and part of second via portion 38a being closer. Therefore offsetting second via portion 38a would not provide the same benefit as offsetting the remainder of second via portions 38.

Thermo-mechanical stress applied to solder bumps 28 is transferred to layers 20, 22, BEOL pads 14 and ILD layers 15, 16. As previously noted, ILD layers 15, 16 are prone to cracking and/or de-lamination. Layers 20, 22, on the other hand, are relatively soft and can tolerate some deformation without cracking, breaking or delaminating from adjacent layers of package 10. Deformation of layers 20, 22 absorbs stress. Layers 20 and 22 therefore have a cushioning effect, absorbing some stress so that less stress is transferred to BEOL pads 14 and ILD layers 15, 16. The above-described geometry of vias 24 provides additional material of layers 20 and 22 below solder bumps 28 in the areas which experience high thermo-mechanical stress, that is, on the side of each solder bump 28 located farther away from the centres of die 12 and semiconductor chip 11. Thus, relative to a die without offset via portions, more stress can be absorbed by deformation of layers 20 and 22 rather than being transferred to BEOL pads 14 and ILD layers 15, 16.

As depicted in FIGS. 2-3, first via portions 36 are aligned with BEOL pads 14, which are evenly distributed over die 12 in a grid pattern. Second via portions 38 are of a consistent size and a consistent offset distance from the corresponding first via portions 36. The maximum allowable offset distance is governed by process limitations. In addition, as will be appreciated, each one of second via portions 38 must overlap the corresponding first via portion 36. In the depicted embodiment, the offset distance is determined by the size of the first and second via portions 36 and 38.

Figure 4:
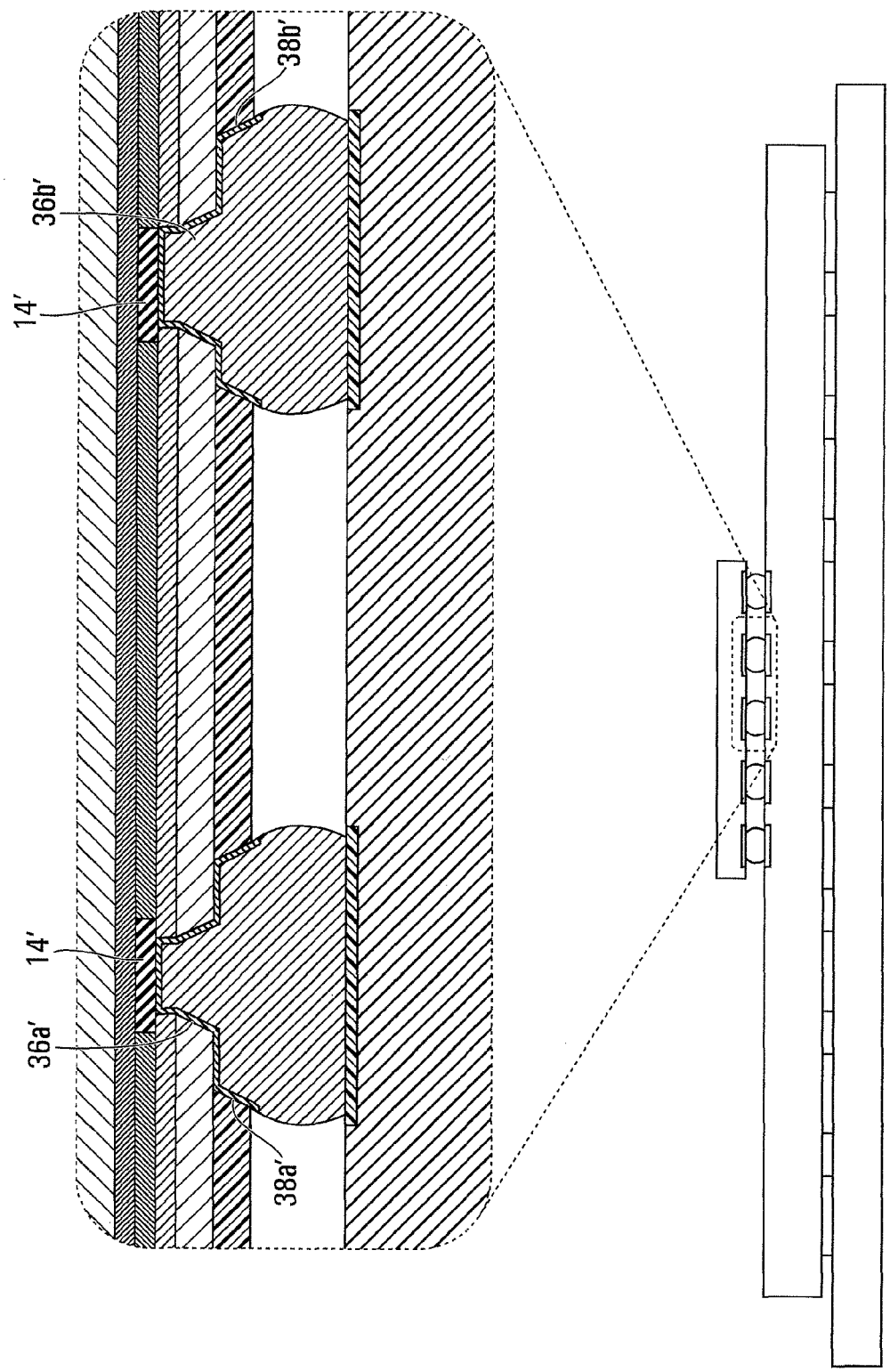
FIG. 4 is a cross-sectional view of a semiconductor package exemplary of an alternate embodiment of the invention.

As depicted in FIG. 3, each one of second via portions 38 is offset from the corresponding one of first via portions 36 outwardly along a radial line that passes through the centre of die 12 and semiconductor chip 11 and the centre of the respective first via portion 36. For example, line 55 intersects axis 42 along which the first via portion 36b of via 24b extends and axis 46, which passes through the centres of die 12 and semiconductor chip 11. Axis 44, along which second via portion 38b extends, is offset from axis 42 outwardly along line 55. For via portions which are symmetrical and have circular openings, such as the frustoconical via portions depicted in FIGS. 3-4, this results in second via portions 38 located at the farthest possible distance from the centre of die 12 for a given offset distance. In this configuration, solder bumps 28 will bond to substrate 26 at the regions which experience the highest stress, maximizing the stress-mitigating effect.

In other embodiments, the arrangement of BEOL pads 14, first via portions 36 and/or second via portions may differ. For example, the distance and direction of offset between the first and second via portions 36 and 38, that is, between the longitudinal axes along which they extend, may be varied based on the location of a particular via 24. For example, vias 24 which are closer to the centres of die 12 and semiconductor chip 11 may have smaller offsets than those farther from the centres of die 12 and semiconductor chip 11. In some embodiments, second via portions 38 of different vias 24 may have differing sizes. For example, vias 24 located towards the corners of die 12 may have larger second portions 38 than those of other vias. In some embodiments, the size of outer via portions and the offset size may vary proportionally with the distribution of thermo-mechanical stress.

In some embodiments, vias 24 may be grouped into patterns centred on the centres of die 12 and semiconductor chip 11. For example, in FIG. 3, vias 24b through 24i are arranged in a first generally rectangular or square pattern centred at the centres of die 12 and semiconductor chip 11. The first via portions of vias 24b through 24i are laterally offset relative to the respective second via portions in a direction towards the centres of die 12 and semiconductor chip 11 (equivalently, the second via portions of vias 24b-24i are offset from the respective first via portions in a direction away from the centres of die 12 and semiconductor chip 11). The size of the offset is consistent for each one of vias 24b through 24i making up the first generally rectangular pattern. Vias 24j through 24y are arranged in a second generally rectangular pattern that is concentric with the first generally rectangular pattern. That is, the first and second generally rectangular patterns are both centred on the centres of die 12 and semiconductor chip 11. The first via portions of vias 24j through 24y are laterally offset relative to the respective second via portions in a direction towards the centres of die 12 and semiconductor chip 11 (equivalently, the second via portions of vias 24j-24y are offset from the respective first via portions in a direction away from the centres of die 12 and semiconductor chip 11). The size of the offset is consistent for each one of vias 24j through 24y making up the second generally rectangular pattern. In some embodiments, the offset size of the second pattern may be different than the offset size of the first pattern. For example, the offset size may be larger for the second pattern, each member of which is farther from the centres of die 12 and semiconductor chip 11 than the members of the first pattern. In some embodiments, vias 24 may be arranged in concentric patterns which are not rectangular. For example, vias 24 may be arranged in circular or oval-shaped rings.

In some embodiments, a die may have only a single layer of insulating material. In such embodiments, vias may have asymmetrically tapered boundaries such that each via's opening proximate the attachment surface is laterally offset from the centres of die and semiconductor chip relative to the via's opening proximate the corresponding BEOL pad. The via openings proximate the attachment surface may also be larger than the corresponding via openings proximate the BEOL pads. Relative to a die without offset vias, such an arrangement would provide additional insulating material below the solder bumps on the side farthest away from the die and semiconductor chip centres, that is, in the areas which experience high thermo-mechanical stress.

Though semiconductor package 10 is depicted in FIGS. 1-4 with a central via 24a, central via 24a may alternatively be omitted from semiconductor package 10.

In FIGS. 1-3, the first portion 36 of each via 24 is centred over the respective BEOL pad 14. However, in an alternate embodiment, depicted in FIG. 4, first via portions 36' may be offset relative to BEOL pads in much the same way as second via portions 38' are offset relative to first via portions 36'. This will result in second via portions 38' being located farther away from the centre of die 12 relative to the embodiment of FIG. 1, for a given offset distance between the first and second via portions.

Referring now to FIGS. 5A-5K, an exemplary process for manufacturing an integrated circuit die and interconnecting it to a substrate will now be described. The process is described and illustrated with reference to a single die 12 comprising a single semiconductor chip 11, however the steps of fabricating die 12 could instead be performed on a wafer comprising multiple semiconductor chips before singulation.

As previously noted, semiconductor package 10 is assembled in flip-chip. Therefore, as depicted in FIGS. 5A-5I, the sub-assembly of die 12 is upside-down relative to FIG. 1.

As shown in FIG. 5A, semiconductor chip 11 is formed on or in a semiconductor substrate in a conventional manner. Semiconductor chip 11 includes active circuit elements and a series of conductive traces and layers of dielectric material to interconnect the active circuit elements to one another and to I/O pads. This series of interconnecting and insulating elements is referred to as the BEOL stack. BEOL stack design and fabrication is well-known to skilled persons. Accordingly, for simplicity of illustration and explanation, only one BEOL pad 14 and two layers of dielectric material (ILD) 15, 16 are shown. BEOL pad 14 is connected to other elements of the BEOL stack by conductive traces passing through ILD layer 15, however for simplicity, these are not shown.

Passivation material 18 is deposited overlaying the BEOL stack. Passivation material 18 serves to protect die 12 from corrosion. Passivation material 18 may be formed by a chemical vapour deposition process, such as a plasma-enhanced chemical vapour deposition process (PECVD) or a low pressure chemical vapour deposition process (LPCVD). Silicon oxide passivation material may be formed by a PECVD process using silane ($SiH_4$) and nitrous oxide (N2O) or oxygen ($O_2$) or by a LPCVD process using tetraethyl orthosilicate ($Si(OC_2H_5)_4$) or dichlorosilane ($SiH_2Cl_2$) with nitrous oxide. Silicon nitride passivation material may be formed by a PECVD process using silane and ammonia ($NH_3$) or nitrogen ($N_2$) in the presence of argon. For simplicity, passivation material 18 is depicted as a single layer. However, passivation material 18 may consist of a multilayer stack, consisting of an adhesion layer (NBlok), overlaid with layers of SiN, and $SiO_2$ which may optionally be overlaid with a further layer of SiN. Typically, passivation material 18 is between 500 nm and 3000 nm thick.

A mask 60 is formed overlaying passivation material 18 using a lithographic process. Mask 60 has openings 62 at the desired locations of vias 24—in particular, openings 48 of vias 24. Typically, mask 60 is a photoresist mask.

Once mask 60 has been formed, passivation material 18 is etched to create openings through passivation material 18 corresponding to openings 62. The etching may be any suitable known etching technique, such as a reactive ion etch, selected based on the composition and thickness of passivation material 18. A technique which is selective to passivation material 18 should be used, so as to remove as little of BEOL pads 14 as possible. Mask 60 is removed, e.g. by a solvent that is selective to the mask material. FIG. 5B shows in-progress semiconductor package 10 after etching of passivation layer 18 and removal of mask 60.

A layer 20 of insulating material is deposited overlaying passivation material 18. The insulating material of layer 20 may be photo-sensitive, and may be deposited, for example, using a spin-coating process. In the finished state of die 12, first portions 36 of vias 24 are formed in layer 20. Accordingly, the thickness of layer 20 is determined at least in part by the desired thickness of first via portions 36.

FIG. 5C shows in-progress die 12 with layer 20 of insulating material. After deposition of layer 20, first via portions 36 of vias 24 through layer 20 are created. The following process is one example of a suitable process for forming tapered vias through a positive-acting photosensitive polyimide. As will be appreciated, different processes could be used, for example, to form vias of different shapes (e.g. cylindrical) or using different materials.

First, layer 20 is patterned using a lithographic exposure process. For example, areas of layer 20 may be lithographically exposed using ultra-violet radiation through a photomask. Exposure causes the exposed regions to become soluble to a developing solution.

Exposed layer 20 is immersed in a developer which selectively dissolves the exposed regions 63, forming first via portions 36 as shown in FIG. 5D. Following developing, layer 20 may be cured, making it resilient against further developing processes.

As shown in FIGS. 5C-5D, exposed region 63 and first via portion 36 have tapered boundaries. The shape of exposed region 63 and the degree (slope) of tapering of the walls of via portion 36 are influenced by exposure energy (dose and time of exposure), the degree of pre-cure (e.g. on a hot plate after spin coating of layer 20) and the develop recipe (developer chemistry, develop time and spray pattern).

Figure 5E:
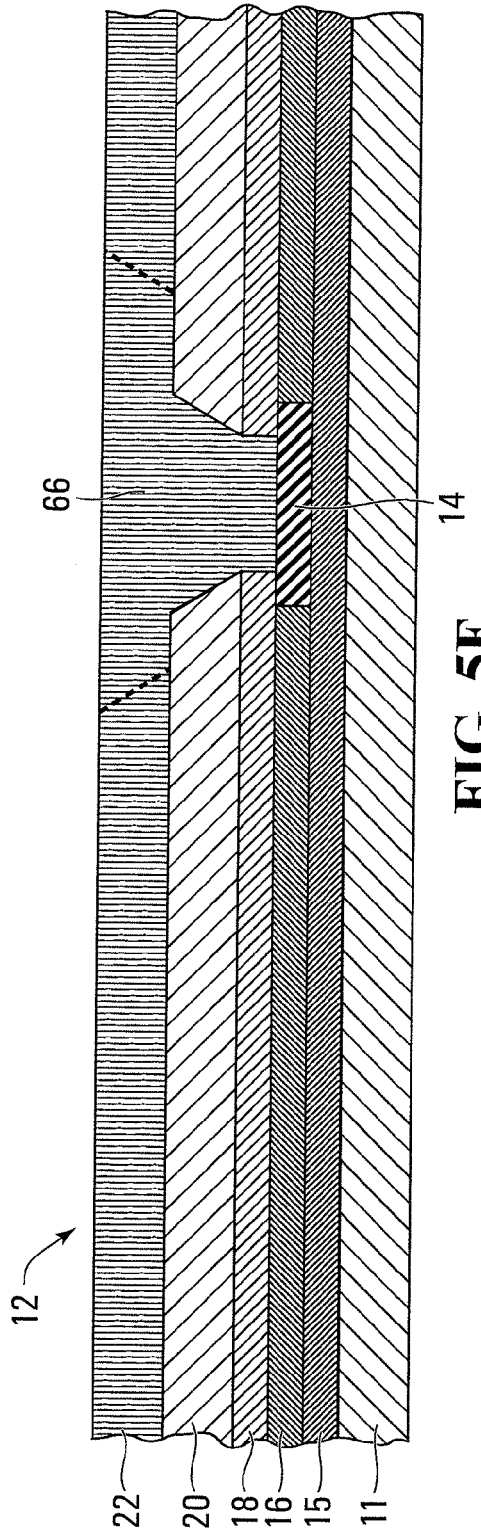

A second layer 22 of insulating material may be deposited on layer 20, as shown in FIG. 5E. Layer 22 may be deposited in a similar manner to layer 20. It is then exposed and developed in a similar manner to layer 20 to create second via portions 38.

Layer 22 may be of a different material than layer 20, such that a developing process can be selected to remove material from layer 22 while removing little or no material from layer 20. Alternatively, layers 20 and 22 may be of the same material if layer 20 is cured before layer 22 is deposited, such that layer 22 may be developed without removing a substantial amount of material from layer 20.

Figure 5F:
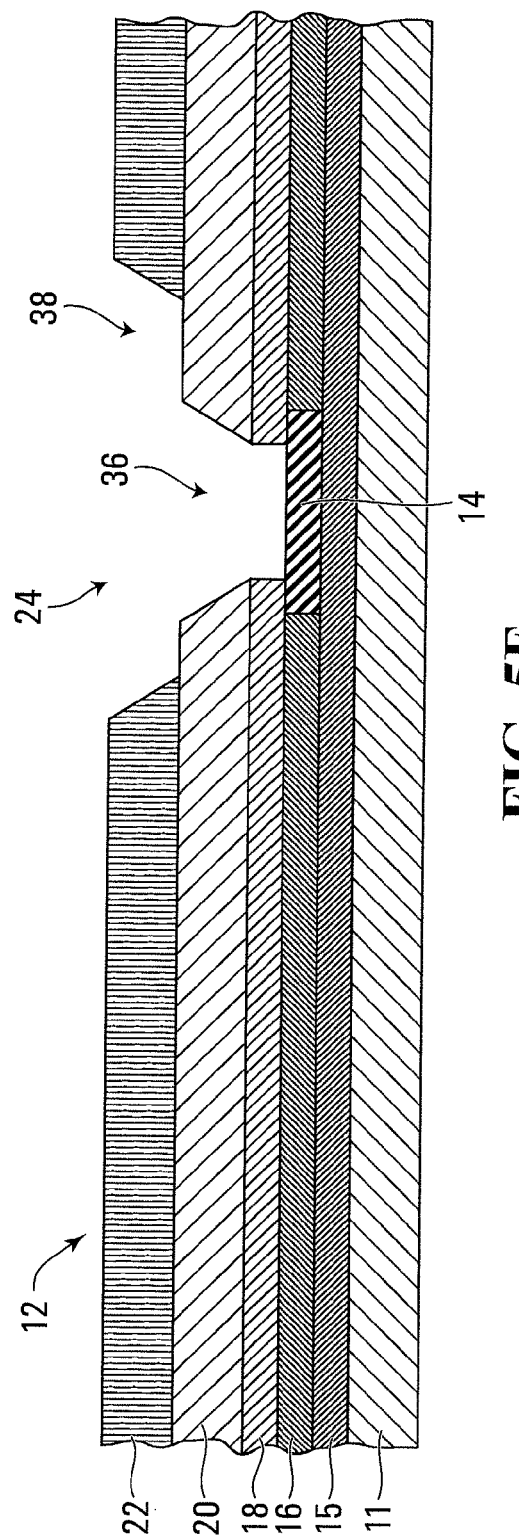
Figure 5K:
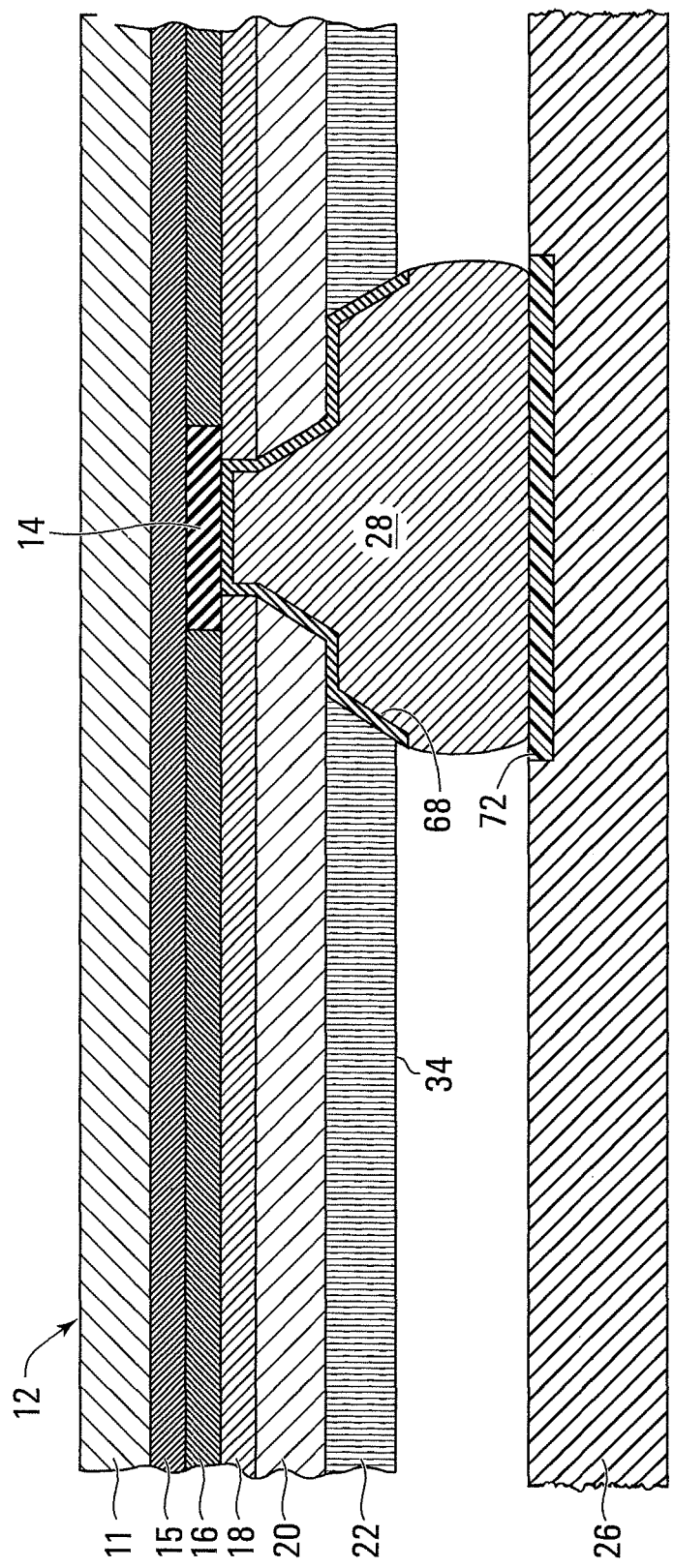

As shown in FIG. 5E, exposed area 66 of layer 22 has tapered boundaries, similar to exposed region 63. Exposed area 66 is also larger than first via portion 36, such that after layer 22 is developed, a portion of layer 20 will be uncovered. Exposed area 66 is also offset from first via portion 36. As shown in FIG. 5F, once layer 22 has been developed, the cavities forming first portions 36 and second portions 38 of vias 24 have been defined.

As the first portions 36 of vias 24 are formed in layer 20 and the second portions 38 of vias 24 are formed in layer 23, the thickness of layers 20 and 22 is determined at least in part by the desired thickness of first via portions 36 and second via portions 38. Typically, layers 20 and 22 are between 2 µm and 15 µm thick, though most commonly they are between 3 µm and 5 µm thick.

As shown in FIG. 5G, a metallic layer 68 is deposited on die 12 and inside first and second via portions 36 and 38. Metallic layer 68 enables solder bumps 28 to be deposited in vias 24 by electroplating. Optionally, one or more additional metallic layers (not shown) may be formed underlying metallic layer 68 to serve as a barrier between layer 22 and solder bumps 28 and to provide additional stress relief.

A bump-forming layer 70 is overlaid on the one or more metallic layers and is patterned to form openings aligned with openings 54 of second via portions 38 to receive solder material. Bump-forming layer 70 is formed of an electrically insulating material, and may be deposited and patterned (that is, exposed and developed) similarly to layers 20 and 22. Bump forming layer is developed using a solvent that leaves metallic layer 68 intact.

Solder bumps 28 are deposited in vias 24 as shown in FIG. 5H. Solder bumps 28 may be deposited by an electroplating process using metallic layer 68 as the anode, such that solder bumps are only formed on the portions of metallic layer 68 which are exposed to the electroplating bath (that is, the portions within vias 24). Solder bumps 28 are deposited in a pillar-like shape, defined by bump-forming layer 70. Accordingly, the thickness of bump-forming layer 70 must be greater than the desired height of solder bumps 28 to ensure that solder bumps 28 do not protrude during the electroplating process.

As shown in FIG. 5I, following deposition of solder bumps 28, bump-forming layer 70 is removed along with the portion of metallic layer 68 and any underlying metallic layers which lay outside vias 24. Bump-forming layer may be removed, for example, using a solvent selective to bump forming layer 70. Metallic layer 68 and any underlying metallic layers may be removed using etching processes selected to leave solder bumps 28 and layer 22 intact. A reflow process is then applied to form solder bumps 28 into spherical solder balls.

Once solder bumps 28 are deposited and bump forming layer 70 removed, die 12 may be mounted to substrate 26 to form a semiconductor package 10. Of course, if the previous fabrication steps were carried out at the wafer level, that is, if they were performed on a wafer comprising multiple semiconductor chips, the wafer must first be cut into individual dies so that each individual package may be mounted to a substrate 26.

To mount, die 12 is inverted and positioned on substrate 26 such that each of solder bumps 28 sits in contact with a corresponding contact pad 72 on substrate 26, as shown in FIG. 5J. Solder bumps 28 are then heated so they reflow and bond to contact pads 72, electrically and mechanically interconnecting die 12 with substrate 26. Optionally, the region between attachment surface 34 and substrate 26 may be filled with an underfill to seal solder bumps 28 and to mechanically reinforce semiconductor package 10. As will be appreciated, substrate 26 comprises a further series of metallic interconnects and a series of contacts (not shown) by which semiconductor package 10 may be interconnected with a circuit board (not shown) for connection of semiconductor package 10 with other devices.

Embodiments of the present invention may be used in a variety of applications, including DRAM, SRAM, EEPROM and flash memory modules, graphics processors, general purpose processors, CPU's and APU's.

The above-described embodiments are intended to be illustrative only and in no way limiting. The described embodiments of carrying out the invention are susceptible to many modifications of form, arrangement of parts, details and order of operation. The invention, rather, is intended to encompass all such modification within its scope, as defined by the claims.

What is claimed is:

1. An integrated circuit package comprising:
   a semiconductor chip having an integrated circuit formed thereon;
   at least one pad in electrical communication with said integrated circuit;
   an insulating layer overlaying said semiconductor chip, said insulating layer having an attachment surface for attaching said semiconductor chip to a substrate;
   at least one via extending through said insulating layer from said attachment surface to said pad, said via comprising a first via opening proximate said pad and a second via opening proximate said attachment surface, wherein the centre of said second opening is laterally offset from the centre of said first opening in a direction away from a centre of said semiconductor chip;
   a substrate;
   a metallic material received in said via mechanically and electrically interconnecting said pad to said substrate, and attaching said semiconductor chip to said substrate.

2. The integrated circuit package of claim 1, wherein said via comprises a first via portion extending away from said pad along a first longitudinal axis and a second via portion extending away from said attachment surface along a second longitudinal axis, wherein said second longitudinal axis is laterally offset from the centre of said first longitudinal axis in a direction away from a centre of said semiconductor chip.

3. The integrated circuit package of claim 2, wherein said second longitudinal axis is offset from said first longitudinal axis outwardly along a line that passes through said centre of said semiconductor chip and said first longitudinal axis.

4. The integrated circuit package of claim 2, wherein said first longitudinal axis is laterally offset away from a centre of said pad in a direction away from said centre of said semiconductor chip.

5. The integrated circuit package of claim 2, wherein said pad is a back end of line (BEOL) pad.

6. The integrated circuit package of claim 2, wherein said second via portion has a cross-sectional area greater than a cross-sectional area of said first via portion.

7. The integrated circuit package of claim 6, wherein each one of said first and second via portions is frustoconical in shape and the minimum cross sectional area of said second via portion is greater than the maximum cross-sectional area of said first via portion.

8. The integrated circuit package of claim 2, wherein said insulating layer is formed of a polyimide.

9. The integrated circuit package of claim 2, wherein said insulating layer comprises first and second sub-layers, said first via portion extending through said first sub-layer and said second via portion extending through said second sub-layer.

10. The integrated circuit package of claim 2, further comprising a central via extending through said insulating layer from said attachment surface to one of said at least one pads, said central via comprising a first via portion extending away from said pad along a central longitudinal axis passing through the centre of said semiconductor chip, and a second via portion extending away from said attachment surface along said central longitudinal axis.

11. The integrated circuit package of claim 1, comprising at least one inter-layer dielectric (ILD) layer formed between said semiconductor chip and said insulating layer, wherein said ILD layer is formed of a material having a dielectric constant less than 2.7.

12. A method of manufacturing an integrated circuit die comprising a semiconductor chip having an integrated circuit formed thereon and at least one pad in electrical communication with said integrated circuit, said method comprising:
    forming a first insulating layer overlaying said semiconductor chip;
    forming a first via extending from said pad through said first insulating layer along a first longitudinal axis;
    forming a second insulating layer overlaying said first insulating layer; and
    forming a second via in communication with said first via, said second via extending through said second insulating layer along a second longitudinal axis, said second longitudinal axis offset away from said first longitudinal axis in a direction away from a centre of said die.

13. The method of claim 12, further comprising:
    depositing a flowable metallic interconnecting structure in said first and second via;
    inverting said integrated circuit die; and
    interconnecting said integrated circuit die to a substrate by way of said interconnecting structure.

14. The method of claim 12, wherein said first longitudinal axis is offset from said pad in a direction away from said centre of said die.

15. The method of claim 12, wherein said forming said first via comprises exposing said first insulating layer using a photo-lithographic process and removing exposed regions of said first insulating layer using a developer and wherein said forming said second via comprises exposing said second insulating layer using a photo-lithographic process and removing exposed regions of said second insulating layer using a developer.

16. The method of claim 12, wherein said pad is a back end of line (BEOL) pad.

17. The method of claim 12, wherein said first and second vias are frustoconical in shape and the minimum cross-sectional area of said second via is greater than the maximum cross-sectional area of said first via.

18. An integrated circuit die, comprising:
a semiconductor chip with an integrated circuit thereon;
a plurality of pads in electrical communication with said integrated circuit;
an insulating layer overlying said integrated circuit die, said insulating layer having an attachment surface for attaching said semiconductor chip to a substrate;
a plurality of vias, each one of said vias extending through said insulating layer to a corresponding one of said pads for receiving a metallic structure to interconnect said integrated circuit die with a substrate;
wherein each one of said vias has a first opening proximate said semiconductor chip and a second opening proximate said attachment surface and a centre of said second opening is located farther from a centre of said integrated circuit die than the centre of said first opening.

19. An integrated circuit package, comprising:
a substrate;
a die comprising:
a semiconductor chip;
an insulating layer overlying said semiconductor chip;
a plurality of vias through said insulating layer;
a plurality of metallic interconnecting structures, each one of said interconnecting structures received in a corresponding one of said vias and each one of said metallic interconnecting structures bonded to said die at a first end and to said substrate at a second end, wherein said second end is located farther from the geometric centre of said die than said first end.

20. An integrated circuit die, comprising:
a semiconductor chip with an integrated circuit thereon;
a plurality of pads in electrical communication with said integrated circuit;
an insulating layer overlying said integrated circuit die, said insulating layer having an attachment surface for attaching said semiconductor chip to a substrate;
a first plurality of vias, arranged in a pattern, each one of said first plurality of vias extending through said insulating layer to a corresponding one of said pads for receiving a metallic structure to interconnect said integrated circuit die with a substrate;
wherein each one of said first plurality of vias has a first opening proximate said semiconductor chip and a second opening proximate said attachment surface and a centre of said first opening is laterally offset relative to a centre of said second opening by a first distance in a direction towards the centre of said integrated circuit die;
a second plurality of vias, arranged in a pattern concentric with said pattern of said first plurality of vias, each one of said second plurality of vias extending through said insulating layer to a corresponding one of said pads for receiving a metallic structure to interconnect said integrated circuit die with a substrate;
wherein each one of said second plurality of vias has a first opening proximate said semiconductor chip and a second opening proximate said attachment surface and a centre of said first opening is laterally offset relative to a centre of said second opening by a second distance different from said first distance in a direction towards the centre of said integrated circuit die.

21. The integrated circuit die of claim 20, wherein each one of said first plurality of vias is closer to said centre of said integrated circuit die than each one of said second plurality of vias and said second distance is larger than said first distance.

22. The integrated circuit die of claim 20, wherein at least one of said pattern of said first plurality of vias and said pattern of said second plurality of vias is generally rectangular.

23. An integrated circuit die, comprising:
a semiconductor chip with an integrated circuit thereon;
a plurality of pads in electrical communication with said integrated circuit;
an insulating layer overlying said integrated circuit die, said insulating layer having an attachment surface for attaching said semiconductor chip to a substrate;
a plurality of vias, each one of said vias extending through said insulating layer to a corresponding one of said pads for receiving a metallic structure to interconnect said integrated circuit die with a substrate;
wherein said plurality of vias are arranged in at least a first pattern centred at a centre of said integrated circuit die and a second pattern concentric with said first pattern, and each one of said vias has a first opening proximate said semiconductor chip and a second opening proximate said attachment surface, wherein a centre of said first opening is laterally offset from the centre of said second opening in a direction towards the centre of said integrated circuit die and wherein said offset is by a first distance in said vias arranged in said first pattern and by a second distance different from said first distance in said vias arranged in said second pattern.

24. The integrated circuit die of claim 23, wherein each one of said vias arranged in said second pattern is located farther from a centre of said integrated circuit die than each one of said vias arranged in said first pattern and said second distance is larger than said first distance.

25. The integrated circuit die of claim 23, wherein at least one of said first pattern and said second pattern is generally rectangular.

* * * * *